United States Patent [19]

Cowley et al.

[11] Patent Number: 4,810,976
[45] Date of Patent: Mar. 7, 1989

[54] FREQUENCY DOUBLING OSCILLATOR AND MIXER CIRCUIT

[75] Inventors: Nicholas P. Cowley, Wroughton; Rodney J. Lawton; Thomas D. S. McClelland, both of Swindon, all of Great Britain

[73] Assignee: Plessey Overseas Limited, Ilford, England

[21] Appl. No.: 60,708

[22] PCT Filed: Oct. 21, 1986

[86] PCT No.: PCT/GB86/00647
§ 371 Date: Aug. 13, 1987
§ 102(e) Date: Aug. 13, 1987

[87] PCT Pub. No.: WO87/02842
PCT Pub. Date: May 7, 1987

[30] Foreign Application Priority Data

Oct. 22, 1985 [GB] United Kingdom ............... 8525985

[51] Int. Cl.[4] ............................................. H03B 5/00
[52] U.S. Cl. ................................ 331/117 R; 455/318
[58] Field of Search ........ 331/117 R, 117 FE, 116 R, 331/116 FE; 455/318, 323, 333

[56] References Cited

U.S. PATENT DOCUMENTS

| | | | |
|---|---|---|---|
| 3,302,118 | 1/1967 | Schoen | 455/321 |
| 3,384,836 | 5/1968 | Gregory | 331/117 |
| 3,581,235 | 5/1971 | Siu | 331/116 R X |
| 3,899,753 | 8/1975 | Malaviya | 331/117 R X |
| 4,485,355 | 11/1984 | Scott | 331/117 R X |
| 4,565,978 | 1/1986 | Fenk et al. | 331/117 R |

FOREIGN PATENT DOCUMENTS 1512485  2/1969  Fed. Rep. of Germany .

OTHER PUBLICATIONS

S. S. Walker et al. "Negative Resistance Oscillators with Inverse Hyperbolic Tangent Non-Linearities" IEEE International Symposium on Circuits and Systems vol. 3 May 2–4 1983, New York (US), pp. 1165–1168.

Primary Examiner—Eugene R. Laroche
Assistant Examiner—Robert J. Pascal
Attorney, Agent, or Firm—Fleit, Jacobson, Cohn & Price

[57] ABSTRACT

An oscillator of balanced design in which a resonant impedance network is connected between the control ports of two matched transistors, and a capacitance is connected in parallel, across the two inputs of these transistors. The inputs of the transistors are connected each to a matched current source. The signals at the transistor outputs are summed together at a common node. Signals of resonant frequency in each arm of the oscillator are equal in magnitude but opposite in phase. Signals at resonant frequency thus cancel whereas signals at the second harmonic frequency add constructively and are thus enhanced. The effect is a net frequency doubling. For high frequency operation, bipolar transistors are utilized. The current sources can be modulated and an IF mixer output derived. Signal of resonant frequency can be extracted and used for signal prescaling. In an equivalent arrangement, an inductance and resonant network replace the resonant network and capacitance just mentioned.

7 Claims, 2 Drawing Sheets

FREQUENCY DOUBLING OSCILLATOR AND MIXER CIRCUIT

TECHNICAL FIELD

The present invention concerns improvements in or relating to the design of oscillators, expecially but not exclusively, oscillators suitable for use in heterodyne applications.

Implimentations of the invention, as discussed below, may be adapted, for example, for use in the tuning circuits of satellite communication receivers.

BACKGROUND ART

The operational frequency of oscillators is limited by the properties of transistors used and the technology adopted for their implimentation. Thus, for example, implimentations based upon conventional 3-micron size geometry, silicon material, bipolar technology are limited to operational frequencies at most just below to within the lower extreme of S-band (ie. the band 2-4 $GH_Z$) operation. Hitherto, advance beyond this limit requires either considerable circuit complexity and high component count, or, resort to alternative and expensive advanced technologies, at present in their infancy, ie. smaller geometry and/or faster (ie. higher electron mobility semiconductor—eg. gallium-arsenide) material technologies.

It is known to employ oscillators in a dual purpose role in the construction of tuning circuits—ie. both as a local oscillator source and as a mixer. Applications here likewise are restricted by the frequency limit of the oscillator adopted.

It is of particular note that C-band transmission is specified as an International Standard for Satellite communications. There is an urgent need for oscillators and mixer-oscillators for this application, devices that can be produced with minimal complexity, at low cost, and that can be implimented using well-established and reliable process technology.

DISCLOSURE OF THE INVENTION

The invention, as disclosed herein, is intended to fulfill the need aforesaid. An oscillator is provided wherein signal at the second harmonic of the fundamental frequency can be generated, enhanced relative to signal at the fundamental frequency and, extracted as useful signal. This invention therefore, is an advance over oscillators implimented using the same technology, but capable only of producing useful signal of fundamental frequency.

In accordance with the present invention there is provided an oscillator, this oscillator being of a balanced configuration and comprising:
  a pair of matched transistors;
  a pair of matched current sources, one connected to the input port of each transistor;
  first impedance means connected between the control port of each transistor;
  second impedance means connected between the input port of each transistor;
  one of said impedance means being a resonant impedance network;
  the other impedance means being a reactance;
  the choice of transistors, resonant network and reactance, being such that the reactance shall appear as a shunt of negative resistance across the resonant network, and such as to sustain oscillation at network resonant frequency; and,
  a summing output node, connected to the output port of each transistor, for extraction of useful enhanced signal at the second harmonic of the resonant frequency.

At resonance, and in the case of perfect matching, the signals output from the transistors have components at the fundamental resonant frequency that are equal in magnitude but in antiphase. These components therefore cancel at the summing node. The characteristic of each transistor is non-linear and harmonics are also generated. Signal components at odd harmonic frequency are likewise of equal magnitude and also in antiphase. These also cancel at the summing node. Signal components at the second harmonic and at other even harmonics are however in-phase and sum. The second harmonic signal is thus enhanced and produced as useful output.

In practical circumstances, matching is unlikely to be perfect. However, at the output node, signal at the resonant frequency will be significantly attenuated, and the signal at second harmonic frequency substantially enhanced as a result.

In the oscillator, defined above, it is of considerable advantage that signal at double the resonant frequency can be extracted as useful signal. Thus, for example, using 3 $\mu$m silicon bipolar process technology, it is now possible to produce simple design, low component count oscillators, which produce useful signal at frequencies hitherto provided by fundamental oscillators of greater complexity and higher component count. In particular, it is possible not to design oscillators for C-band frequency operation using conventional bipolar devices.

Other advantages of the invention, and advantages of particular embodiments thereof, will become apparent from the description that is given below.

It is noted that the transistors employed are most conveniently of bipolar type, since the high speed of operation, characteristic of these devices, can be exploited. Notwithstanding, other types of transistor, for example MOS field effect transistor, junction field effect transistor types and the like, may be employed, and the invention defined above used to extend the useful range of frequency that can be readily attained.

The resonant network, referred to above, may be parallel, series or combination tuned. It may also include one or more components of continuous or stepwise variable impedance, thus making it possible either to tune the oscillator over a range of frequencies, or to select each one of a set of discrete attainable frequencies. It may be floated or it may be tied to a reference potential. In the latter case, it is important that it be of a balanced design, so that oscillator balance is not unduly disturbed, for otherwise the requisite signal enhancement would be diminished.

It is noted that the current sources need not be ideal. In the simplest implimentation, matched resistors may be used as sources.

The current source may be such as to provide only DC current. In this case, the output signal will be comprised of signals at the second harmonic and other even harmonics only.

Alternatively, the current sources may be such as to provide AC modulated current. It is of especial significance that in this case the output signal will be comprised not only of signals at the second harmonic and other even harmonics, but also of side-band signals derived from the AC modulated current signal. With this modification, therefore, it can be seen that the oscillator can be used in a dual purpose role, ie. as a source of oscillation and as a mixer.

The oscillator, defined, can thus be employed as the local oscillator or as the oscillator-mixer of a heterodyne tuning circuit. A further advantageous feature of this oscillator is that signal at the resonant fundamental frequency may be made available by simple modification of the circuit—ie. it may be extracted by simple connection to the control port or input port of one or both transistors. It is preferable that connection is made to both transistors, and in a balanced manner, to avoid assymetrically loading the oscillator. In many receiver circuits ÷N scaling of local oscillator signal is requisite. Since second harmonic frequency signal and the ÷2 frequency signal, the fundamental, are both available, the first ÷2 prescaler, in any case difficult to impliment at 2 $GH_Z$ frequency, can be omitted, saving also both cost and component count.

Referring to the impedance means, it is preferable that the resonant network is connected between the control ports of the transistors. The reactance is, in this case, a capacitor or capacitative network. Capacitors of suitable value can be implimented by on-chip construction.

In the less favored alternative, the resonant network is connected between the input ports of the transistors. In this latter case the reactance is an inductor or inductive network. It is not however practical to impliment inductors of suitable value by means of on-chip construction. Where the oscillator is constructed on-chip, pins must be provided for connection to an external inductor, making this alternative altogether less attractive.

BRIEF INTRODUCTION OF THE DRAWINGS

In the drawings accompanying this specification:

DESCRIPTION OF PREFERRED EMBODIMENTS

Embodiments of the invention will now be described, by way of example only, with reference to the accompanying drawings.

Figure 1:
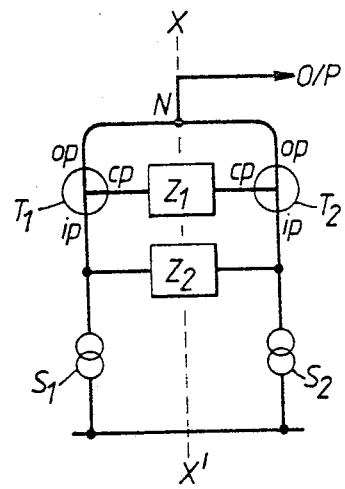
FIG. 1 is a block schematic circuit diagram of an oscillator configured in accordance with this invention.

An oscillator of balanced design is shown in FIG. 1. This comprises a pair of matched transistors $T_1$, $T_2$ the input ports ip of which are connected to current sources, $S_1$, $S_2$. A first impedance $Z_1$ is connected between the control ports cp of the two transistors $T_1$, $T_2$. A second impedance $Z_2$ is connected between the input ports ip of the two transistors $T_1$, $T_2$. The output ports op of these transistors $T_1$, $T_2$ are connected together tapped short-circuit connection. This latter provides, a summing node N, from which output signal is extracted.

Figure 2:
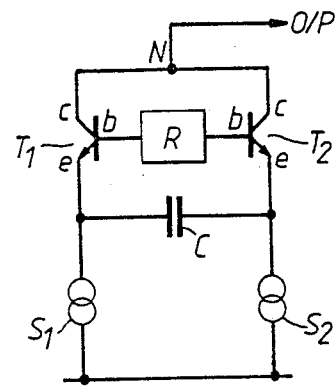
FIGS. 2 and 3 are circuit diagrams of two alternative implimentations of the oscillator shown in the preceding figure.

A bipolar transistor implimentation of this circuit is shown in FIG. 2. Here a resonant impedance network R is connected across the bases b of the two transistors $T_1$, $T_2$ and a capacitor C is connected across the two emitter inputs e of the transistors $T_1$, $T_2$. The collector outputs c are connected to the summing node N.

Figure 4:
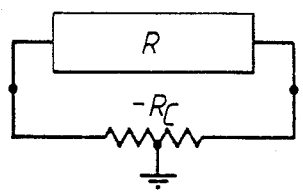
FIG. 4 is an equivalent circuit diagram for a resonant circuit and load.

In operation, the capacitance C appears as a negative resistive shunt $-R_c$ "across" the resonant network R (See FIG. 4). This impedance transformation results from transistor action, where a quadrature phase lag is introduced across the emitter and base of each transistor:

$$-R_c = B \cdot Z(C) = -\frac{w_T}{jw} \frac{1}{jwC} = w_T/w^2C. \qquad \text{Equation 1.}$$

In the equation appearing above, B is the impedance transform factor of each transistor, w is the angular frequency, and $w_T$ the angular transformation frequency ($2\pi f_T$) of each transistor [$f_T$ is defined here as the frequency at which transistor current gain is unity].

For oscillation to build up, it is requisite that the resonant impedance (a purely resistive term, R) of the resonant circuit should not exceed the value of the negative resistance:

$$w_T/w_R^2C > R \qquad \text{Inequality 1.}$$

Where this inequality is satisfied, power, effectively generated by the negative resistance $R_c$, outweighs power dissipated in the resonant network R and signal, at resonant frequency $f_R$, builds up. The large signal gain of the transistors $T_1$, $T_2$ falls as signal level increases, and, a point is reached where power generation is matched by power dissipation and a steady-state level of oscillation is produced.

Signals applied to the base b of the transistors $T_1$, $T_2$ are maintained in antiphase by the resonant circuit R. Resonant frequency signals at the collector outputs c of the transistors are thus of opposite phase. Since the oscillator is of balanced design, the signals are of equal magnitude. These signals thus cancel at the summing node N. However, signals at the second harmonic, as also signals at higher even harmonics, are maintained in-phase. These add at the node N. Thus with cancellation of the fundamental and enhancement of the second harmonic, the result is a net frequency doubling.

Figure 5:
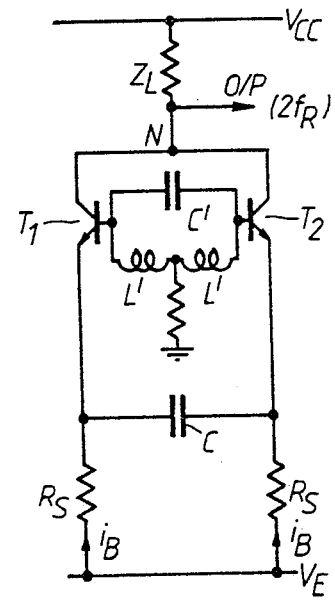
FIG. 5 is a circuit diagram showing practical detail for the implimentation of FIG. 2 above; and, FIGS. 6 and 7 are, respectively, a block schematic and a circuit diagram, of a mixer-oscillator configured in accordance with this invention.

Further detail of this oscillator circuit is shown in FIG. 5. The output signal is taken across an impedance load $Z_L$ connected to a collector voltage supply line $V_{cc}$. The resonant circuit R comprises a capacitor C' and a centre-tapped inductor, each branch of which is of inductance L'. Current sources are provided by two matched resistors $R_S$ and a DC bias current $i_B$ is shown flowing through each of these. Typical practical values are tabulated below:

TABLE I

| | |
|---|---|
| Output frequency, | $2 f_R$: 2 $GH_Z$ |
| Resonant frequency, | $f_R$: 1 $GH_Z$ |
| Transistor transformation frequency, | $f_T$: 6 $GH_Z$ |
| Resonant capacitance, | C': 0.8 pF |
| Resonant inductance, | L': 8 nH |
| Coupling capacitance, | C: 1 pF |
| Source current (DC), | $i_B$: 6 mA |
| Collector line voltage, | $V_{cc}$: 5 V |
| Source reference voltage, | $V_E$: −2 V. |

Figure 3:
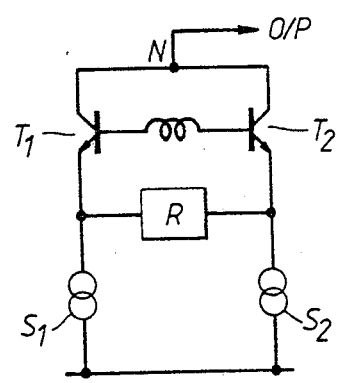

It is noted that a circuit with equivalent performance can be implimented using an inductance L across the transistor bases b, in place of the resonant circuit R, and by inserting this resonant circuit R across the emitters e as shown in FIG. 3. In this configuration, the inductance likewise appears as a shunt of negative impedance across the resonant network R.

Figure 6:
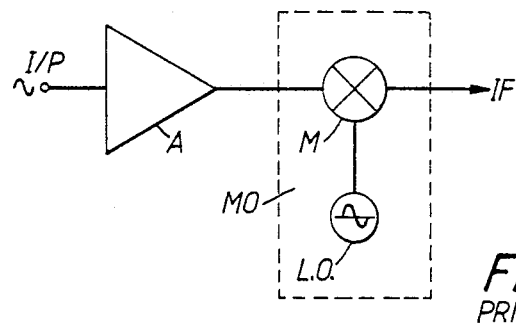
Figure 7:
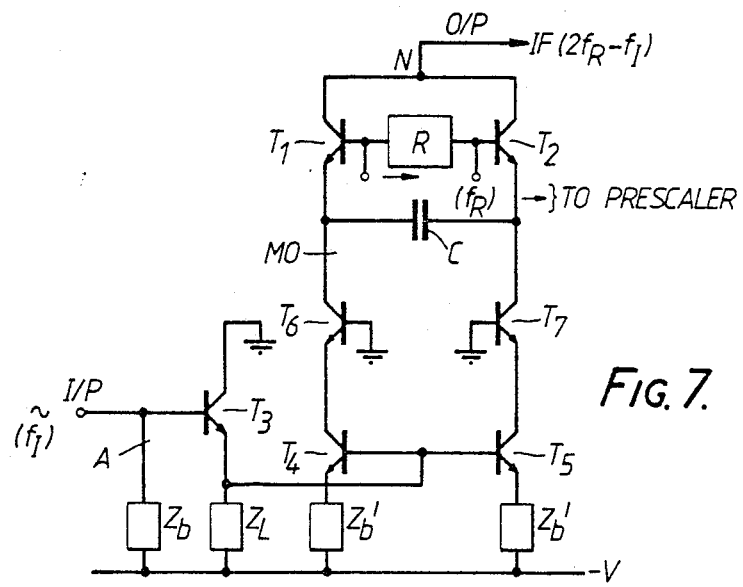

A known synthesis loop arrangement is shown in part in FIG. 6. Here, an input signal is fed to the input I/P of a gain stage A where it either undergoes amplification or voltage/current conversion. It is then fed to a common mixer-oscillator circuit MO and mixed (M) with local oscillator (LO) signal to produce a sideband signal at intermediate frequency (IF). The oscillator discussed above may be utilized as mixer-oscillator in this application. A practical circuit is shown in FIG. 7.

The trans-conductance stage A shown is an emitter follower comprising a transistor $T_3$, and bias and load impedances $Z_b$, $Z_L$ arranged in conventional manner. The signal output from this trans-conductance stage is thereafter applied to modulate the source current. Each current source $S_1$, $S_2$ of the oscillator MO comprises a pair of transistors ($T_4$, $T_6$ and $T_5$ and $T_7$) and a bias impedance $Z'_b$. The bases of transistors $T_6$ and $T_7$ are connected to device earth. The signal is then applied to the bases of the two other transistors $T_4$ and $T_5$ and thus modulates the source current at input frequency $f_I$. A signal of frequency ($2f_R - f_I$) is thus developed at the oscillator node input N. Signal at resonant frequency $f_R$ may be extracted elsewhere in the circuit—eg. from tapped base electrodes, as shown, and used for prescaling. The input signals can be, for example:

(i) IF frequencies (typically 950 to 1750 $MH_Z$) from the outdoor unit of a direct broadcast satellite (DBS) system;
(ii) Direct C-band transmission (ie. 4 $GH_Z$); and,
(iii) C-band transmissions prescaled by a divide-by-two circuit (ie. 2 $GH_Z$).

We claim:

1. A frequency doubling, negative resistance oscillator which is of balanced configuration and consists in:
   first and second voltage lines;
   a pair of matched bipolar transistors each having an emitter, a base and a collector;
   a pair of matched current sources, connected respectively between the emitter of each transistor and the first voltage line;
   first impedance means connected between the base of each transistor;
   second impedance means connected between the emitter of each transistor;
   one of said first and second impedance means being a resonant impedance network;
   the other of said first and second impedance means being a reactance;
   a short circuit connection, connected between the collector of each transistor, and having a first output tap for extraction of an useful enhanced signal varying at the second harmonic of the fundamental resonant frequency of said oscillator; and,
   load impedance means connected between said short-circuit connection and the second voltage line.

2. An oscillator, as claimed in claim 1, wherein the first impedance means is a resonant impedance network, and the second impedance means is a capacitance.

3. An oscillator, as claimed in claim 1, wherein the first impedance means is an inductance and the second impedance means is a resonant impedance network.

4. An oscillator, as claimed in claim 1, wherein differential output means is provided for extraction of a signal of resonant frequency, said differential output means consisting in second and third output taps connected respectively to the matched bipolar transistors.

5. An oscillator, as claimed in claim 1, wherein each current source aforesaid is responsive to input signal for modulating source current.

6. In a receiver circuit:
   a prescaler; and,
   a frequency doubling, negative resistance oscillator which is of balanced configuration and consists in:
   first and second voltage lines;
   a pair of matched bipolar transistors each having an emitter, a base and a collector;
   a pair of matched current sources, connected respectively between the emitter of each transistor and the first voltage line;
   first impedance means connected between the base of each transistor;
   second impedance means connected between the emitter of each transistor;
   one of said first and second impedance means being a resonant impedance network;
   the other of said first and second impedance means being a reactance;
   a short circuit connection, connected between the collector of each transistor, and having a first output tap for extraction of an useful enhanced signal varying at the second harmonic of the fundamental resonant frequency of said oscillator;
   load impedance means connected between said short-circuit connection and the second voltage line; and,
   second and third output taps connected respectively to the matched bipolar transistors; wherein,
   the second output tap is connected to the prescaler aforesaid to input thereto a signal varying at the fundamental resonant frequency of the oscillator.

7. A receiver circuit, as claimed in claim 6, wherein each current source aforesaid is responsive to input signal for modulating source current.

* * * * *